(12) United States Patent
Thurgate et al.

(10) Patent No.: US 7,671,405 B2
(45) Date of Patent: Mar. 2, 2010

(54) DEEP BITLINE IMPLANT TO AVOID PROGRAM DISTURB

(75) Inventors: Timothy Thurgate, Sunnyvale, CA (US); Yi He, Fremont, CA (US); Ming-Sang Kwan, San Leandro, CA (US); Zhizheng Liu, San Jose, CA (US); Xuguang Wang, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/646,157

(22) Filed: Dec. 26, 2006

(65) Prior Publication Data
US 2008/0153274 A1    Jun. 26, 2008

(51) Int. Cl.
*H01L 27/112*     (2006.01)
*H01L 21/336*     (2006.01)

(52) U.S. Cl. .............................. 257/324; 257/E21.423; 257/E21.679; 257/E29.309; 438/261; 438/262; 438/288; 438/305

(58) Field of Classification Search ................. 438/257, 438/288, 305, 595; 257/324, E21.423, E21.679, 257/E29.309
See application file for complete search history.

(56) References Cited

U.S. PATENT DOCUMENTS

| | | | | |
|---|---|---|---|---|
| 6,556,475 B2* | 4/2003 | Yamazaki et al. | ...... | 365/185.03 |
| 7,341,912 B2* | 3/2008 | Choi et al. | .................. | 438/257 |
| 2007/0004135 A1* | 1/2007 | Chindalore | ................. | 438/257 |
| 2008/0076221 A1* | 3/2008 | Kang et al. | ................. | 438/267 |
| 2008/0153223 A1* | 6/2008 | Liu et al. | .................... | 438/257 |

\* cited by examiner

*Primary Examiner*—M. Wilczewski
*Assistant Examiner*—Toniae M Thomas
(74) *Attorney, Agent, or Firm*—Eschweiller & Associates, LLC

(57) ABSTRACT

A method of forming at least a portion of a dual bit memory core array upon a semiconductor substrate, the method comprising performing front end processing, performing a first bitline implant, or pocket implants, or both into the first bitline spacings to establish buried first bitlines within the substrate, depositing a layer of the spacer material over the charge trapping dielectric and the polysilicon layer features, forming a sidewall spacer adjacent to the charge trapping dielectric and the polysilicon layer features to define second bitline spacings between adjacent memory cells, performing a deep arsenic implant into the second bitline spacings to establish a second bitline within the structure that is deeper than the first bit line, removing the sidewall spacers and performing back end processing.

22 Claims, 11 Drawing Sheets

DEEP BITLINE IMPLANT TO AVOID PROGRAM DISTURB

FIELD OF INVENTION

The present invention relates generally to semiconductor processing and in particular to deep bitline implants in memory devices in order to avoid program disturb, for reducing voltage disturbances in non-selected memory cells while selected memory cells are being programmed.

BACKGROUND OF THE INVENTION

Several trends continue to be present in the semiconductor and electronics industry. Devices continue to be made smaller, faster and require less power while operating. One reason for this ongoing trend is that personal electronic devices are being fabricated that are designed to be smaller, and yet at the same time, packaged with greater memory capability. For example, cellular phones, personal computing devices, recorders, and personal sound systems are getting smaller while the memory capability, speed and computational power are expanding. In light of these trends, there is an ever increasing demand in the semi-conductor industry for smaller and faster transistors to provide the core functionality of the integrated circuits used in these devices.

Accordingly, in the semiconductor marketplace there is a continuing trend toward manufacturing integrated circuits (ICs) with higher densities. To achieve high densities, there has been and continues to be efforts toward scaling down dimensions (e.g., submicron levels) on semiconductor wafers. In order to accomplish these higher densities, smaller feature sizes and reduced separation between features, more precise feature shapes are required to be placed on the small rectangular portions of the wafer, commonly known as dies. This may include the width and spacing of interconnecting lines, the diameter of contact holes, as well as the surface geometry of various other features (e.g., corners and edges), and the like. The scaling-down of integrated circuit dimensions results in faster circuit performance and/or switching speeds, and can lead to higher effective yields in IC fabrication by providing more circuits on a silicon die and/or more silicon die per semiconductor wafer.

The process of manufacturing integrated circuits involves numerous process steps, during which hundreds/thousands of copies of an integrated circuit are formed on a single wafer. This process can create electrically active regions in and on the semiconductor wafer surface. A typical process of manufacturing these active areas in a metal-oxide-semiconductor-field-effect-transistor (MOSFET) requires ion implanting of the source and drain. With devices becoming smaller and smaller the current approach within the industry has been to implant ions shallowly so that the lateral and vertical junctions are shallow, as well.

However, short channel effects have to be minimized as the industry scales down the memory cells. A common known problem within the industry is that as one cell is programmed, the cell next to it is erroneously programmed as well, commonly referred to as "program disturb". Although not totally understood, one possibility is that electrons or holes are migrating around to the other side of the device and programming the cell.

Accordingly, it would be desirable to allow transistors to be scaled down while preventing erroneous or undesired programming of the cell.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One aspect of the present invention pertains to making of the drain junction deeper, which is counter to normal scaling that is currently performed in the semiconductor industry. By implanting the drain junction deeper it "forces" the electrons to have to travel farther to get around the drain to program the other cell and thus results in a reduction in program disturb.

As a result, more devices can be "packed" within the same or a smaller area without false programming taking place.

According to one or more aspects of the present invention, a method of performing a normal shallow arsenic implant, forming a spacer, and then performing a high energy arsenic implant to implant deeper within the substrate. The spacer allows the implant to be moved back from the memory device to minimize the detrimental impact on the device. The deep implant reduces program disturb on the adjacent bit.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
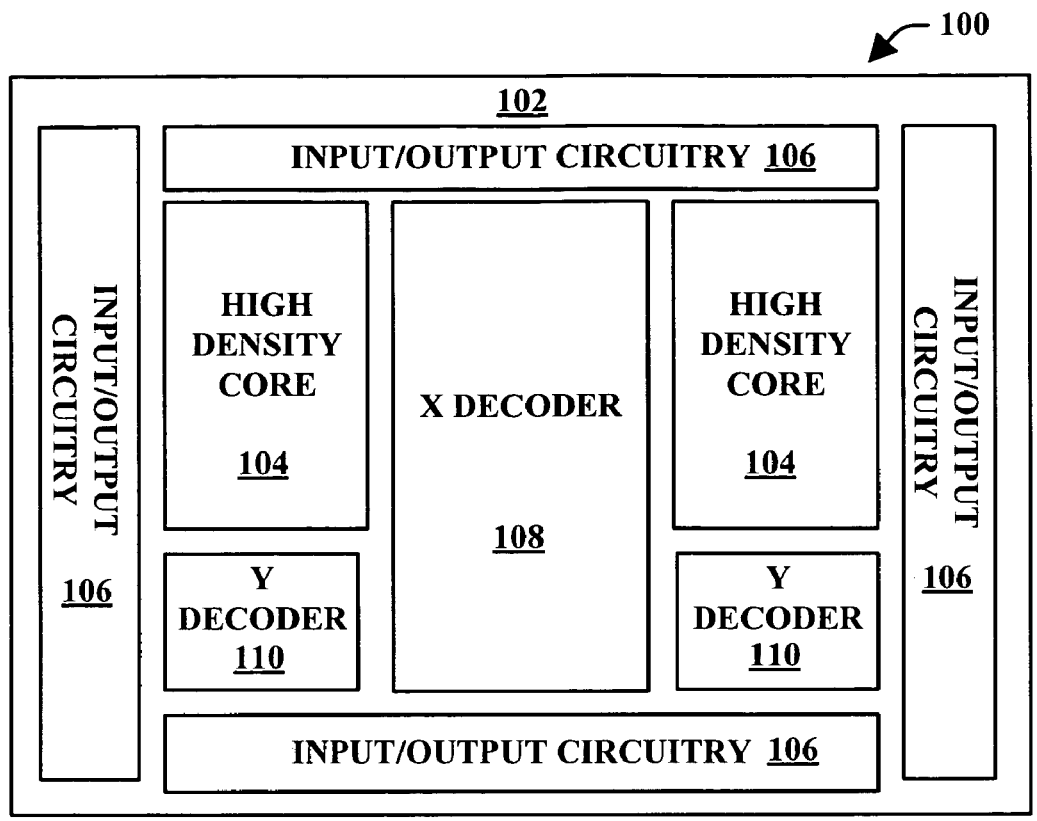
FIG. 1 is a top view of a dual bit flash memory device, according to one aspect of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form, in order to facilitate describing one or more aspects of the present invention.

The present invention pertains to implementing a deep bit line implant process in forming a transistor based memory device in order to avoid program disturb. The process employs a deep bitline that allows buried bitlines to be formed utilizing high implantation energy and deep implantation depths producing narrower bitlines than conventional bitlines in order to reduce short channel effects. As a result, more devices can be "packed" within the same or a smaller area.

Referring initially to FIG. 1, a top view of an exemplary dual bit flash EEPROM 100 is illustrated. The memory 100 generally incorporates a semiconductor substrate 102 in which one or further high-density core regions 104 and one or more lower-density peripheral portions are formed. The high-density core regions 104 characteristically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that collaborate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
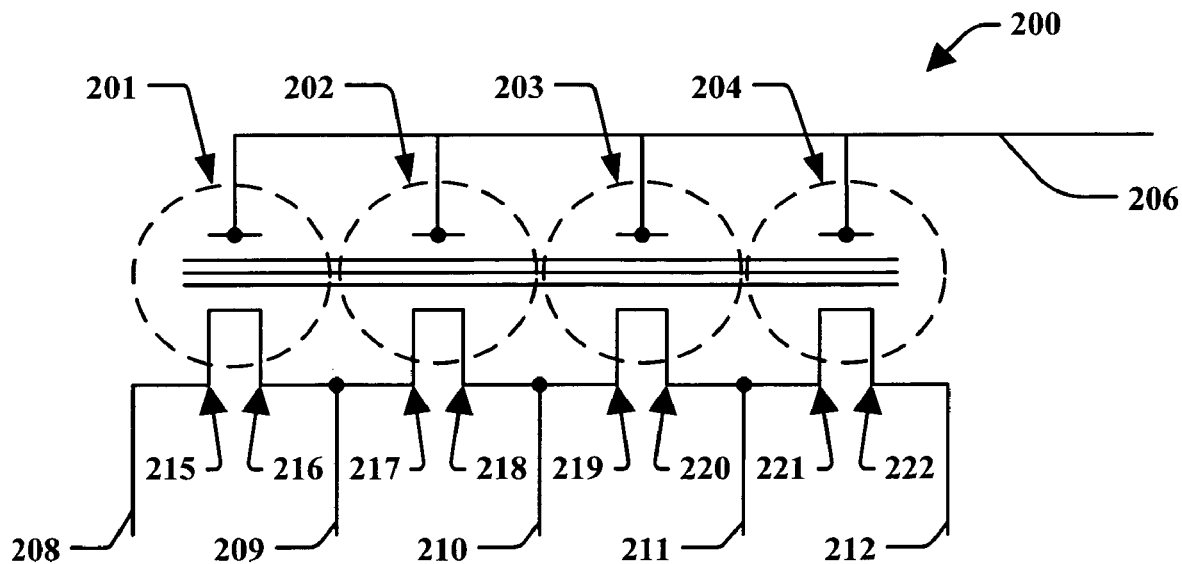
FIG. 2 is a schematic illustration of a portion of a wordline of a memory core such as may include at least part of one of the cores depicted in FIG. 1 in a virtual ground type architectural configuration, according to another aspect of the present invention.

Turning now to FIG. 2, a schematic illustration is presented of a portion of a memory core 200 such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline 206 and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells may not interfere with each other because the memory cells are typically programmed one at a time and in such instances only one memory cell is active at a time while programming.

Figure 3:
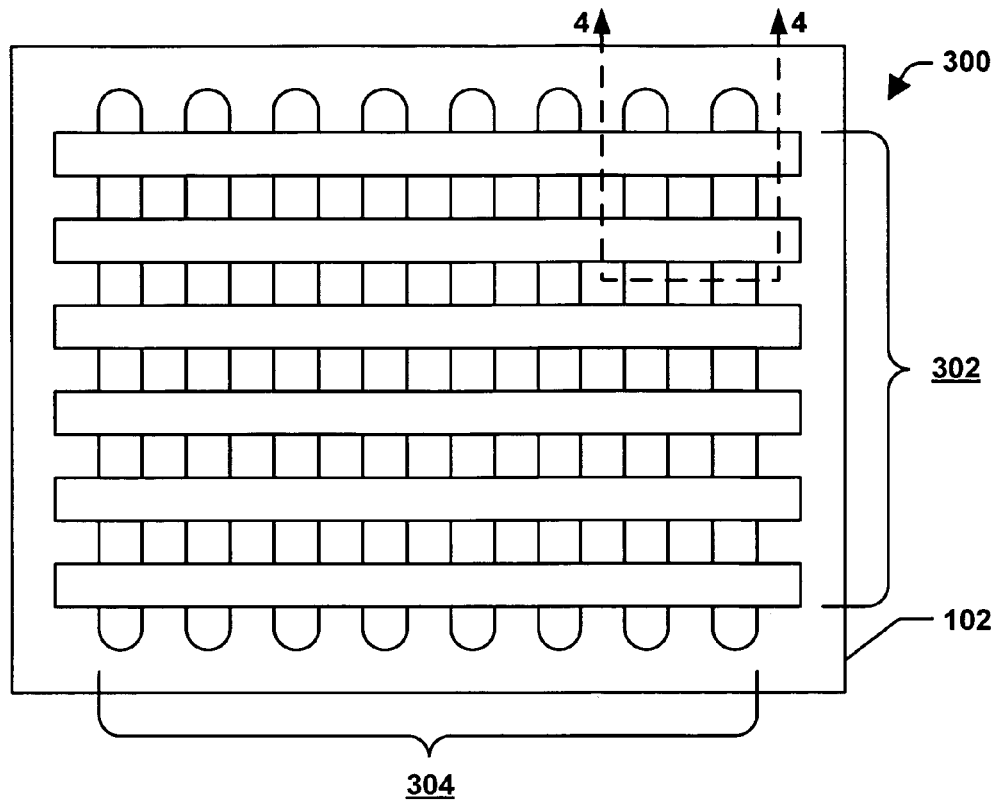
FIG. 3 is a top view of at least a portion of a memory core, such as may include at least part of one of the cores depicted in FIG. 1, according to yet another aspect of the present invention.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
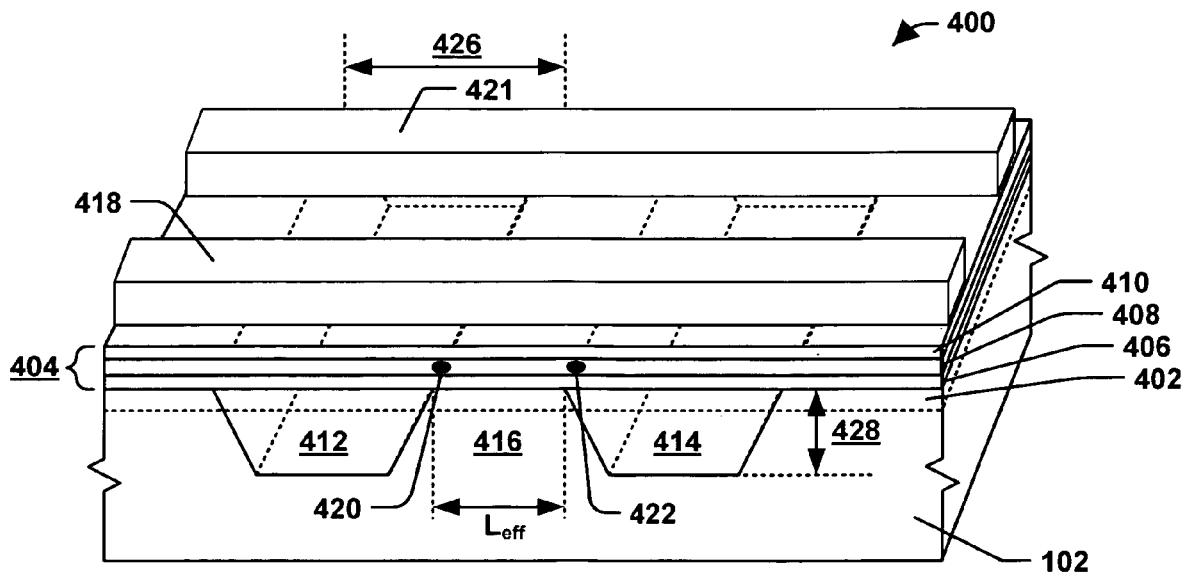
FIG. 4 is a cross-sectional isometric illustration of a portion of a dual bit flash memory, such as that taken along line 4-4 of FIG. 3, according to one aspect of the present invention.

FIG. 4 is a cross-sectional isometric illustration of a portion 400 of a dual bit flash memory, such as that taken along line 4-4 of FIG. 3. A semiconductor substrate 102 upon which the memory is formed can be doped with a p-type impurity such as boron, for example, to establish an anti-punch through implant region 402 therein. The anti-punch through implant provides a region 402 that is more heavily doped than the semiconductor substrate 102. The substrate is, for example, formed out of silicon and can itself be doped with a p-type impurity. The anti-punch through implant 402 prevents sub-surface leakage current from one bitline to another.

A charge-trapping dielectric layer 404 is deposited over the semiconductor substrate 102 or an optional oxide layer (not shown). The charge-trapping dielectric layer 404 generally can be composed of three separate layers: a first insulating layer 406, which is generally grown, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 421 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 420 and 422 indicate generally where respective bits of data can be stored in one or the cells of the memory 400. It will be appreciated that the channel 416 has an effective length $L_{eff}$ and that the bits 420, 422 will be brought closer together as this length is reduced (e.g., as a result of scaling). As such, the bits themselves may interfere with and/or contaminate one another and operations performed on one bit may affect the other bit should the bits get too close to one another.

In the example shown, the buried bitlines 412, 414 are formed to a width 426 and a depth 428. Conventionally, such a width 426 would be around 120 nanometers, while such a depth 428 would be on the order of around 800 Angstroms, for example. These dimensions coupled, primarily, with the electrical properties of the overlying ONO layer 404 produce a breakdown or threshold voltage (Vt) between the bitlines and wordlines of around 16 volts.

Figure 5:
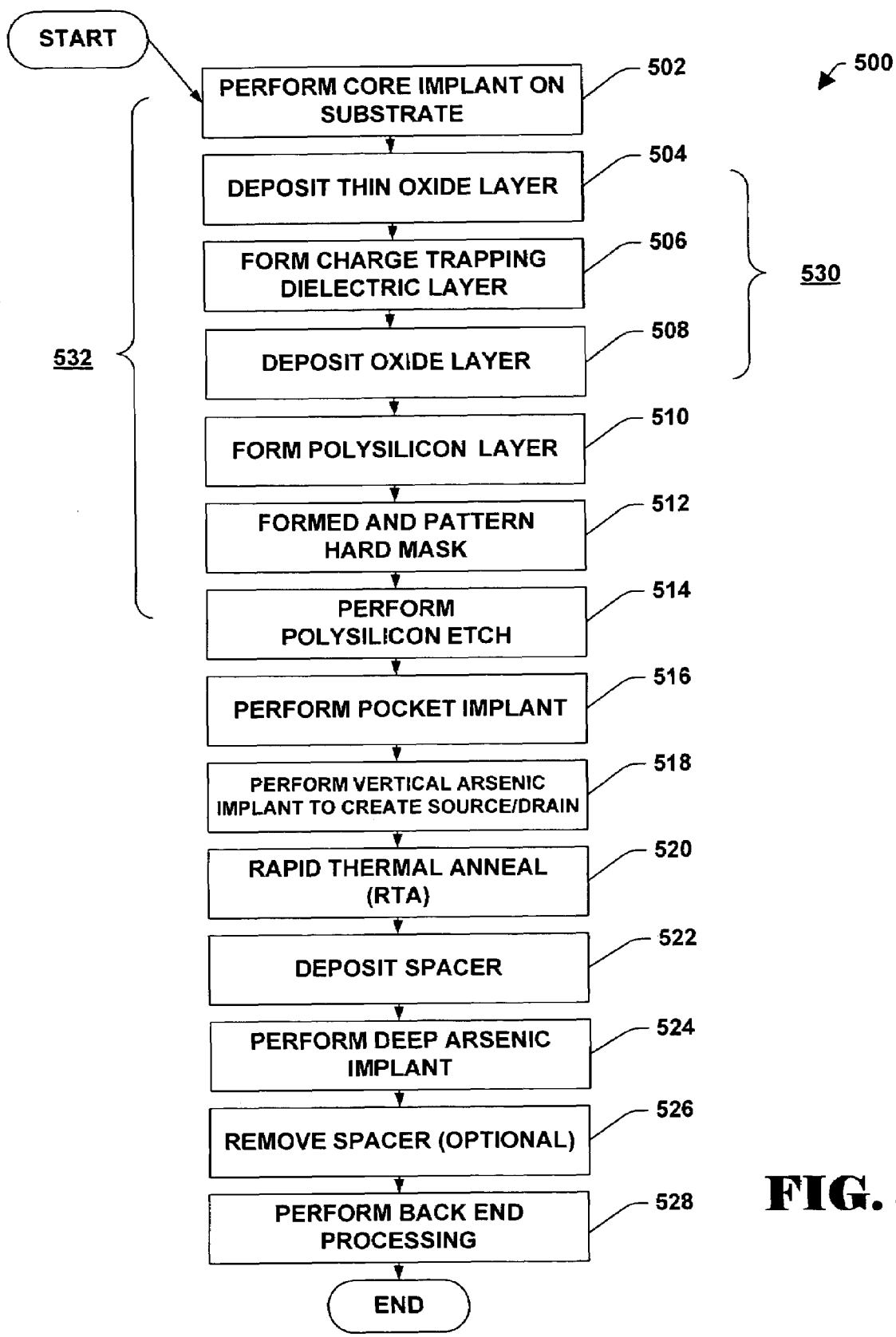
FIG. 5 is a flow diagram illustrating an example of a methodology for forming a memory device in accordance with one or more aspects of the present invention wherein a deep bitline implant can be employed to avoid or reduce program disturb.

Turning to FIG. 5, a methodology 500 is illustrated for forming a memory device according to one or more aspects of the present invention. In particular, the memory employs at least one deep arsenic implant in order to avoid program disturb to make the drain junction deeper. The memory device so formed can, for example, correspond to a portion of a memory core such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to FIGS. 6-18, as well as to devices not shown or described herein.

The memory is formed upon a semiconductor substrate at 502, and an anti-punch through core implant ($V_{anti-punch\ through}$) is performed at 502 to establish a region of the substrate that is more heavily doped than the remainder of the semiconductor substrate. The substrate can, for example, be formed out of silicon and can itself be doped with a p-type impurity such as boron, for example. The anti-punch through implant may include a greater concentration of and/or a higher energy implant of the same or different p-type dopant utilized in the rest of the substrate, for example, and assists in controlling voltage of the memory cell.

At 504, a thin oxide layer can be formed over the semiconductor substrate. The thin oxide layer may be formed of an oxide dielectric such as silicon dioxide ($SiO_2$), for example, to a thickness of about 70 Angstroms or less. At 506 a charge trapping nitride layer is formed over the thin oxide layer. The charge-trapping nitride layer may be formed of a nitride dielectric such as silicon nitride ($Si_xN_y$), for example, and may be formed to a thickness between about 60 to 80 Angstroms, for example. The second insulating layer, which covers the charge-trapping nitride layer, can be formed to a thickness of about 100 Angstroms or less, for example. The oxide-nitride-oxide configuration is commonly referred to as an ONO layer for convenience. Alternatively, poly-islands or other types of charge trapping dielectrics may be formed in accordance with one or more aspects of the present invention, and are well known by those of ordinary skill in the art.

A layer of polysilicon based material(s) can then be formed over the oxide-nitride-oxide layer at 510. This polysilicon layer can be formed to a thickness of between about 900 to 1100 Angstroms, for example. A layer of hardmask material is subsequently formed over the polysilicon layer at 512. An optional antireflective coating (ARC) layer can also be formed over the hardmask, and a resist can be formed over the ARC layer to facilitate patterning the hardmask. The ARC layer in particular can assist with mitigating reflection during exposure and thereby improves the fidelity of pattern transfer. The hardmask can, for example, be formed from oxide or nitride based material(s) that are applied to a thickness of between about 300 to 700 Angstroms, for example.

The hardmask is then patterned at 512 (e.g., after both the resist and optional ARC layers have been patterned, exposed, etched and/or selectively stripped to form a combined photomask for transferring the pattern onto the hardmask). The patterned features formed at 512 within the hardmask correspond, at least partially, to buried bitlines which will be formed within the substrate. More particularly, respective spacings between the features correspond somewhat to buried bitlines that will be implanted within the substrate. The spacings within the hardmask can be formed to have respective widths of between about 100 to 140 nanometers, for example.

In addition, at 514 the polysilicon layer is then plasma etched and the spacings formed within the polysilicon layer have respective widths corresponding somewhat to that of the first bitline spacings. The plasma etch can be an anisotropic process, for example, in which it etches in the vertical direction only. The charge trapping dielectric layer is similarly plasma etched at 514 to include spacings having respective widths, again corresponding to that of the first bitline spacings. The charge trapping dielectric layer (e.g., ONO) is etched away to expose the silicone for a pocket implant utilizing, for example, boron, indium, and the like. Without etching the ONO layer the arsenic would have to be implanted through the ONO layer, which can potentially cause damage in the ONO layer. This could negatively impact the breakdown voltage, for example.

Implants can then be performed at 516 to establish buried bitlines within the exposed semiconductor substrate. The implant can include an n-type dopant, such as arsenic or antimony, for example. The implant can be performed at an energy level of around 5 to 40 KeV, for example. A vertical arsenic implant can then be performed to create a source/drain at 518, referred herein as a first bitline. The first bitline can be formed to relative depths of about 500 Angstroms, for example. The first bitline includes the pocket implant at 516 and the vertical arsenic implant at 518. Additionally, the vertical arsenic implant may be performed at a dosage of about $1e15/cm^2$ for a resulting concentration of about $1e20/cm^3$, for example. Accordingly, the first bitline is formed to a width corresponding substantially to that of the first bitline spacings. In one example, the first bitline is formed to a width of about 70 nanometers.

At 522, an oxide (e.g., oxide based materials) or nitride spacer material is deposited in order to fill the gap between memory devices. This can be done, for example, with a polymer spacer material. The spacer material is then plasma etched for example to form the spacer. The spacer at 522 basically moves the subsequent deep arsenic implant back away from the channel of the memory devices so that the implant doesn't have a large detrimental impact on the device in terms of short channel effects. The spacer material can be deposited to a thickness of between about 50 to 500 Angstroms, for example, and etched to a thickness of between about 50 to 200 Angstroms. The spacer can be utilized to assist in establishing a narrower deeper portion of the bitline. The deposition of the spacer material can be, for example, an isotropic deposition, wherein the spacer grows on both the vertical and horizontal surfaces. As such, the spacer material can be subsequently patterned or plasma etched (e.g., anisotropically etched) to form sidewall spacers adjacent the patterned features of the hardmask, thereby reducing respective spacings between the hardmask features with precision. The spacers can be formed to have respective widths of between about 5 to 20 nanometers, for example. The distance between the spacers defines somewhat respective second bitline spacings having widths somewhere in the neighborhood of around 30 to 60 nanometers, for example. As stated supra, the etched spacer forms a mask for the deep arsenic implant at 524 of method 500.

Similarly, the second bitlines can be formed to relatively deep depths of about 900 Angstroms, for example, as compared to conventional depths of around 500 Angstroms. Additionally, the deep arsenic bitline implant may be performed at a dosage of about $1e15/cm^2$ for a resulting concentration of about $1e20/cm^3$, for example. Accordingly, the second bitlines are formed to a width corresponding substantially to that of the second bitline spacings. In one example, the second bitlines are formed to a width of about 30 to 60 nanometers.

The methodology 500 advances to 526 where the spacer can be removed, and ends thereafter, wherein further back end processing is performed at 528, such as the formation and/or patterning of one or more additional conductive and/or non-conductive layers and/or implantations. For example, at 524 of method 500 the deep arsenic implant can be done prior to removing the potentially damaged spacer, for example, using etchants well known by those skilled in the art. In addition, the methodology referred to in blocks in 502-514 can be referred to as front end processing, for example.

Figure 6:
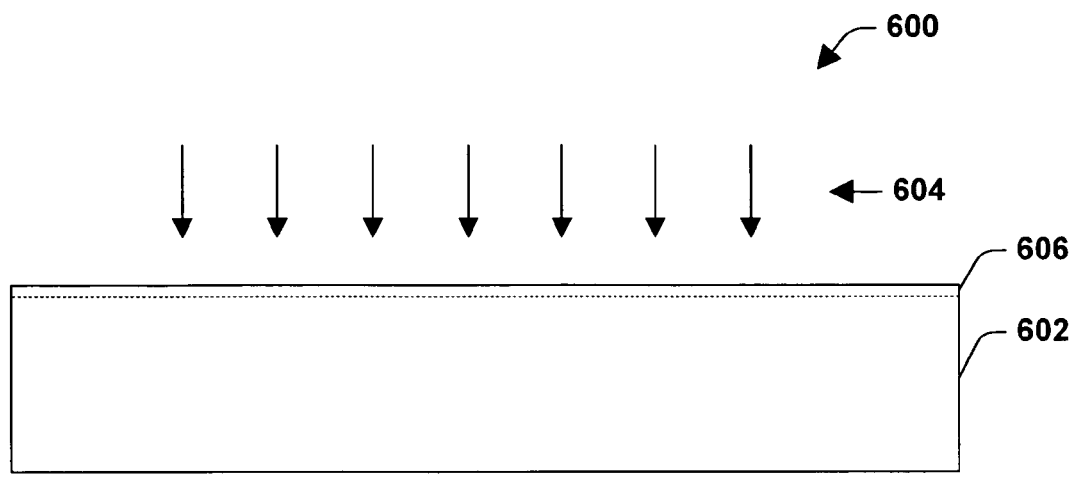
FIGS. 6-17 are cross-sectional illustrations of memory formed according to one or more aspects of the present invention.

Turning now to FIGS. 6-18, exemplary techniques for forming a memory device 600 according to one or more aspects of the present invention is disclosed (FIG. 6). In particular, the memory 600 is formed utilizing a deep bitline arsenic implant in order to avoid program disturb between adjacent devices. The heretofore unfeasible increased capability facilitates scaling and increased packing density. The memory device 600 so formed may, for example, correspond to a portion of a memory core such as may include at least part of one of the M by N array cores depicted in FIG. 1.

Initially, a semiconductor substrate 602 upon which the memory is formed is subjected to an anti-punch through core implantation 604 to establish a region 606 of the substrate 602 that is more heavily doped than the remainder of the semiconductor substrate as illustrated in FIG. 6. The anti-punch through layer, is located below the source/drain region. The substrate may itself be doped with a p-type dopant such as boron, for example, and the anti-punch through implant ($V_{anti\text{-}punch\ through}$) may include a greater concentration of and/or a higher energy implant of the same or different p-type dopant, for example. The anti-punch through core implantation 604 assists in controlling voltage of the memory device 600. The anti-punch through core implantation 604, however, is optional and may be skipped in accordance with the present invention, for example.

It is to be appreciated that reference to substrate 602 or semiconductor substrate 602 as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding and that actual dimensions of the elements may differ substantially from that illustrated herein.

Figure 7:
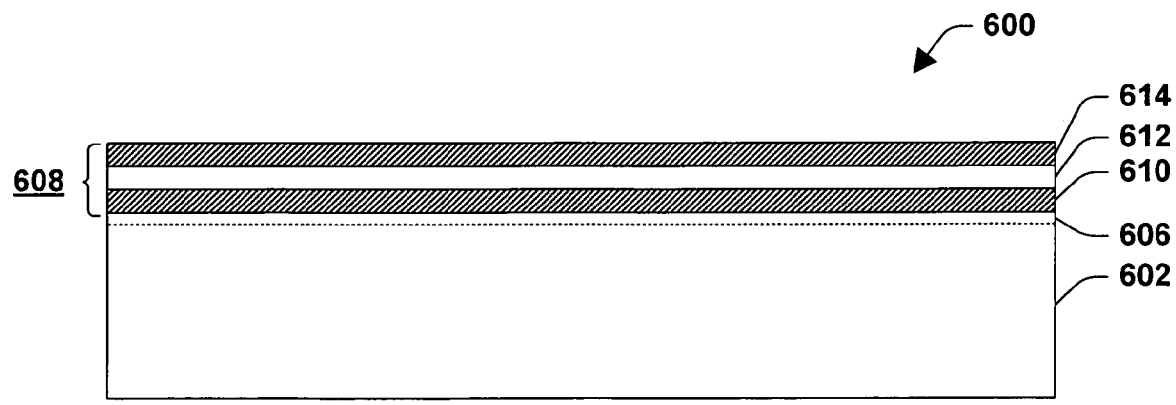

A charge trapping dielectric layer 608 (504, 506 and 508 in FIG. 5) is then formed over the semiconductor substrate 602 (FIG. 7). In the example shown, the charge trapping dielectric layer 608 includes a first insulating layer 610, a charge trapping layer 612 and a second insulating layer 614. The first insulating layer 610 can be formed to a thickness of about 70 Angstroms or less, for example, while the second insulating layer 614 can be formed to a thickness of about 100 Angstroms or less, for example. The first and second insulating layers, 610 and 614 respectively, can include, for example, silicon dioxide. The charge-trapping layer 612 may be formed of a nitride dielectric such as silicon nitride ($Si_xN_y$), for example, and may be formed to a thickness between about 60 to 80 Angstroms, for example. The oxide-nitride-oxide configuration is commonly referred to as an ONO layer for convenience. Alternatively, poly-islands or other types of charge trapping dielectrics may be formed in accordance with one or more aspects of the present invention.

Figure 8:
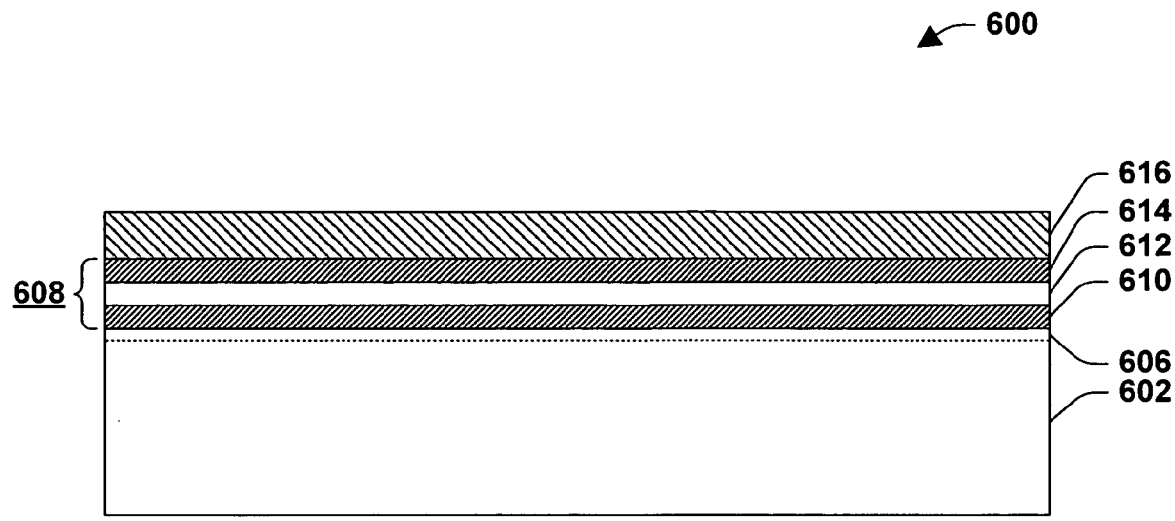
Figure 9:
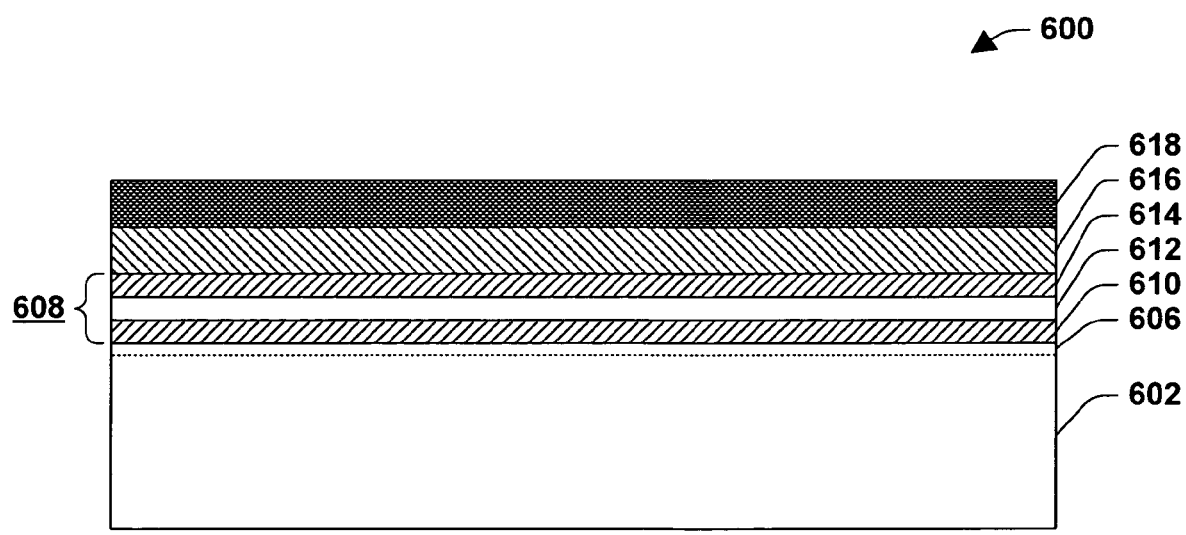

A polysilicon layer of polysilicon based material(s) 616 is then formed over the charge trapping dielectric layer 608 (FIG. 8). This polysilicon layer 616 can be formed to a thickness of between about 900 to 1100 Angstroms, for example. A layer of hardmask material 618 is subsequently formed over the polysilicon layer 616 (FIG. 9). An optional antireflective coating (ARC) layer (not shown), that may include an organic material, can be formed over the hardmask 618, and a resist (also not shown) can be formed over the ARC layer to facilitate patterning the hardmask 618. The ARC layer in particular assists with mitigating reflection during exposure and thereby improves the fidelity of pattern transfer. The hardmask 618 can, for example, be formed from nitride based material(s) that are applied to a thickness of between about 300 to 700 Angstroms, for example.

Figure 10:
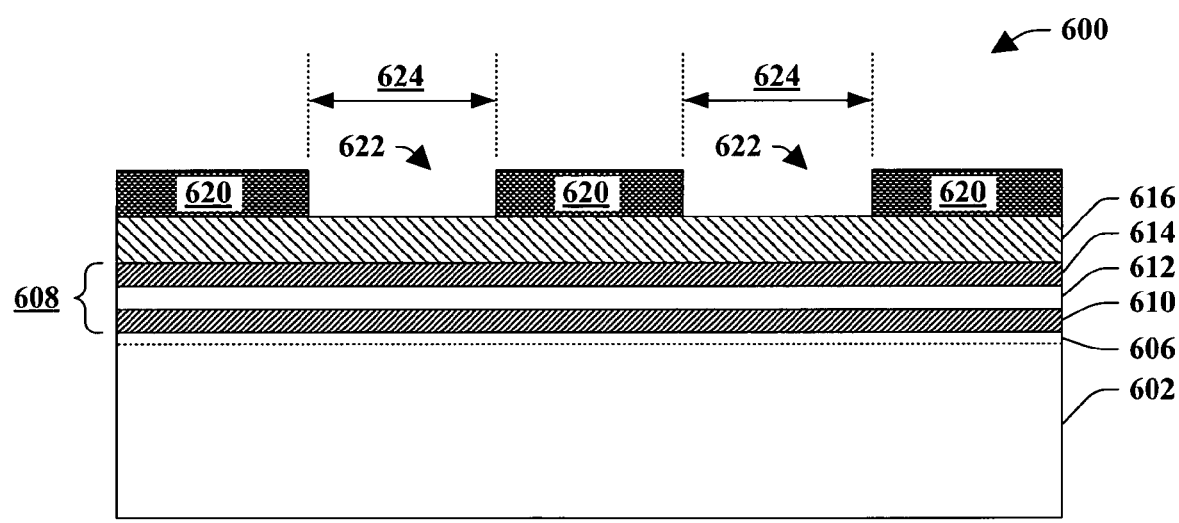

The hardmask 618 is then patterned (e.g., after both the resist and optional ARC layers have been patterned, exposed, etched and/or selectively stripped to form a combined photomask for transferring the pattern onto the hardmask) (FIG. 10). The resulting hardmask features 620 formed (e.g., etched) from the hardmask 618 correspond, at least partially, to buried bitlines which will be formed within the substrate 602. More particularly, respective first bitline spacings 622 between the features 620 correspond somewhat to buried bitlines that will be implanted within the substrate 602. The first bitline spacings 622 within the hardmask 618 can be formed to have respective first widths 624 of between about 50 to 100 nanometers, for example.

Figure 11:
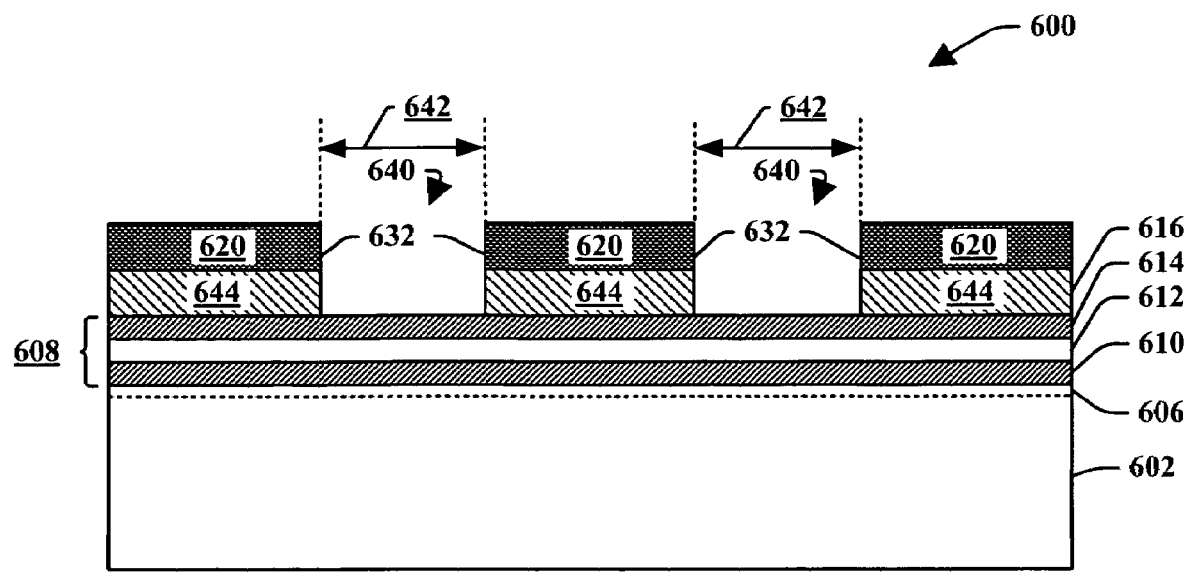

In FIG. 11, the polysilicon layer 616 is then plasma etched 640 and the ONO layer 608 serve as guides and as such, first bitline spacings 642 formed within the poly layer have respective widths corresponding somewhat to that of the first bitline openings 632. The plasma etch 640 is an anisotropic process and in this case it etches in the vertical direction only. The plasma etch 640 removes the polysilicon layer down to the ONO layer 608. The top two layers of the ONO are also etched, leaving only the bottom oxide.

Figure 12:
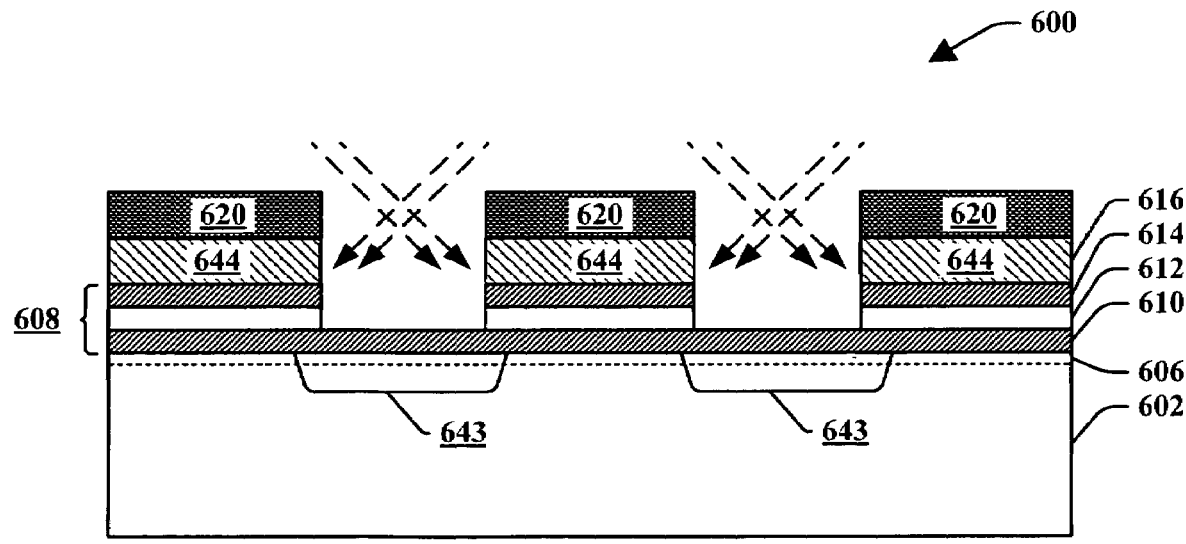

Pocket implants 621 can then be performed as illustrated in FIG. 12. The pocket implant 621 can include an p-type dopant, such as boron, for example. The pocket implant 621 can be performed at an energy level of around 5 to 15 KeV, for example.

Figure 13:
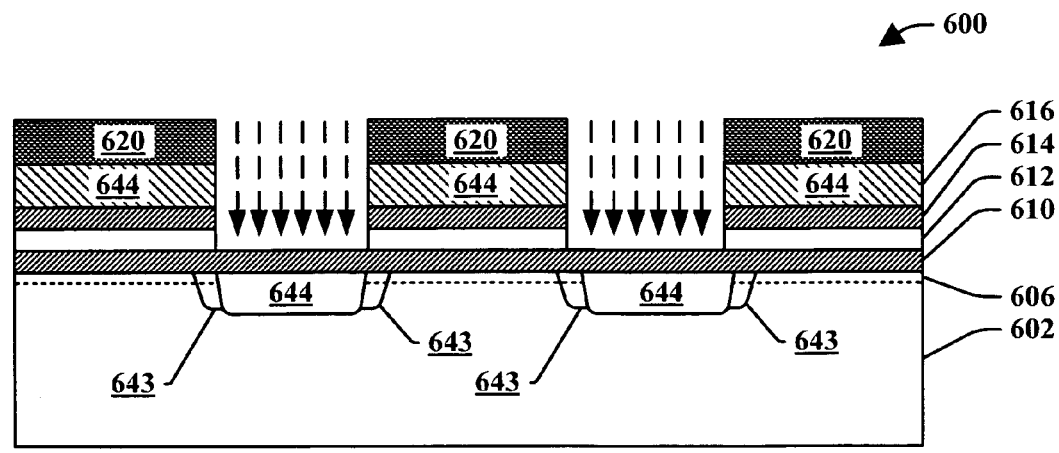

A vertical arsenic implant 623 can then be performed to create a source/drain as illustrated in FIG. 13, referred herein as a first bitline. The first bitline refers to the vertical arsenic implant 623 illustrated in FIG. 13. The first bitline can be formed to relatively depths of about 500 Angstroms, for example. Additionally, the vertical arsenic implant 623 may be performed at a dosage of about 1e15/cm$^2$ for a resulting concentration of about 1e20/cm$^3$, for example. Accordingly, the first bitline is formed to a width corresponding substantially to that of the first bitline spacings. In one example, the first bitline is formed to a width of about 70 nanometers.

Figure 14:
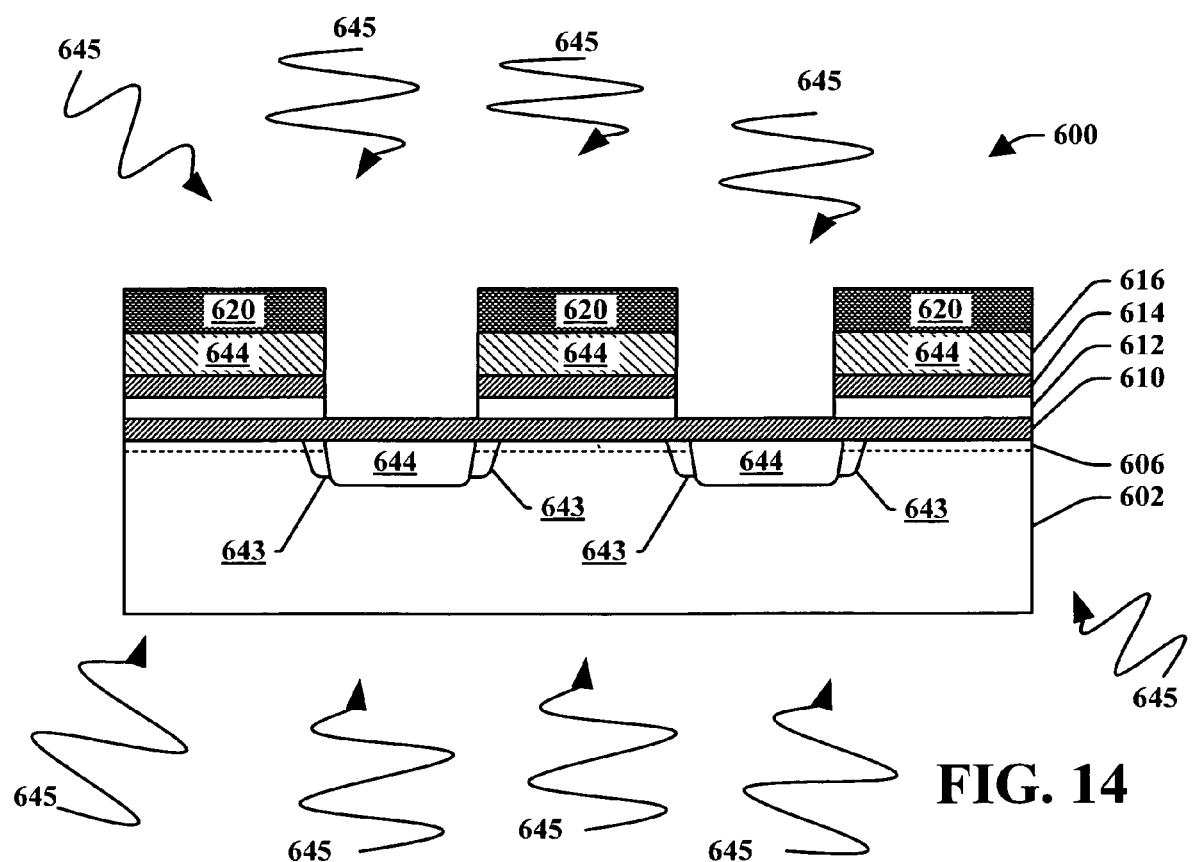

An anneal 645 is next performed as illustrated in FIG. 14, using a rapid thermal anneal (RTA) procedure, to minimize the transient enhanced diffusion during the deposition process. Enhanced diffusion is typically unfavorable for shallow junction formation in advanced transistor designs.

Figure 15:
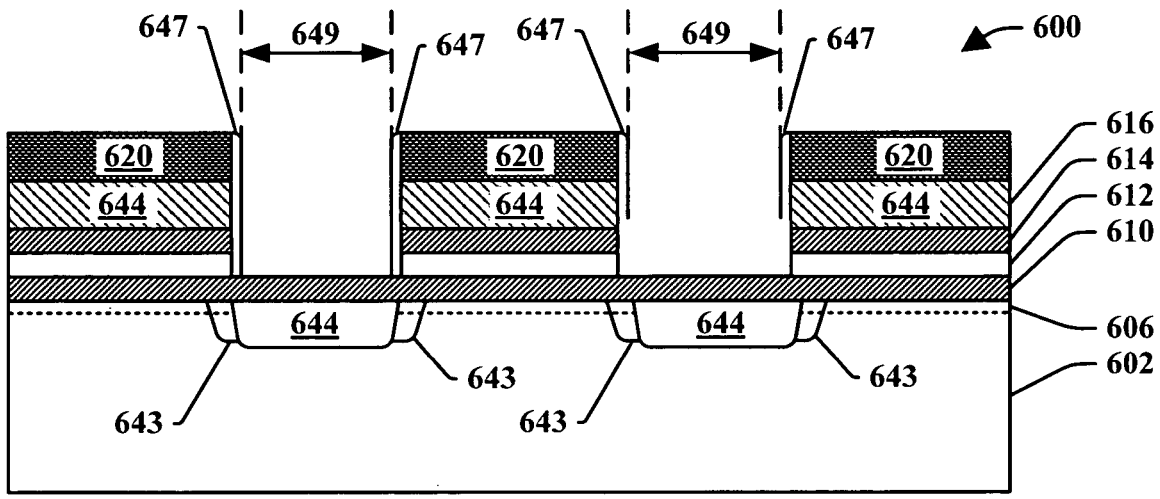
Figure 16:
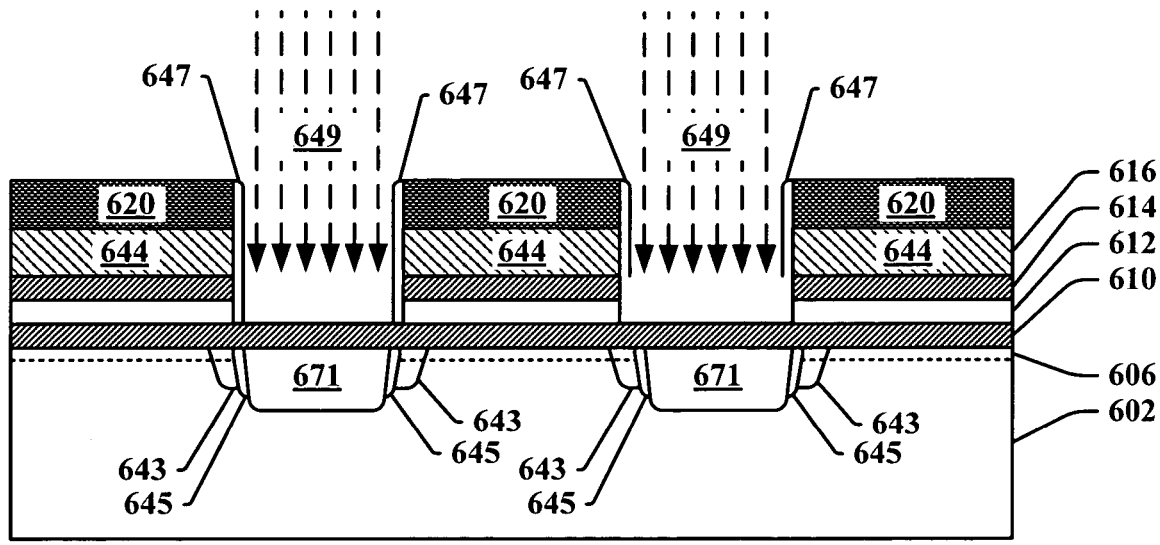

As shown in FIG. 15, a spacer material (e.g., of oxide and/or nitride based material) can be fashioned on the hard mask features 620 and the side walls of the exposed polysilicon 644. The spacer material can be formed to a thickness of between about 50 to 500 Angstroms, for example, and can be employed to form spacers 647 that assist with establishing narrower buried second bitlines and protecting the exposed surfaces from subsequent deep arsenic implantation. The distance between the sidewall spacers 649, referred to as second bitline spacings 649, is approximately 30 to 60 nanometers, for example.

According to yet another aspect of the present invention, a deep arsenic implant 649 is then performed to establish the buried second bitlines 671 within the semiconductor substrate 602 (FIG. 14). The deep arsenic implant 649 can include an n-type dopant, such as arsenic, for example. Since the poly layer 616 and the charge trapping dielectric ONO layer 608 have been patterned with a spacer 647, the implant 649 can be performed at relatively energy levels of around 30 KeV, for example, as compared to conventional implant energies. This resultantly reduces the resources required for and costs associated with forming memory devices, among other things as the bitlines can be implanted to a greater depth without causing greater lateral straggle thus reducing the likelihood of punch through currents.

Figure 17:
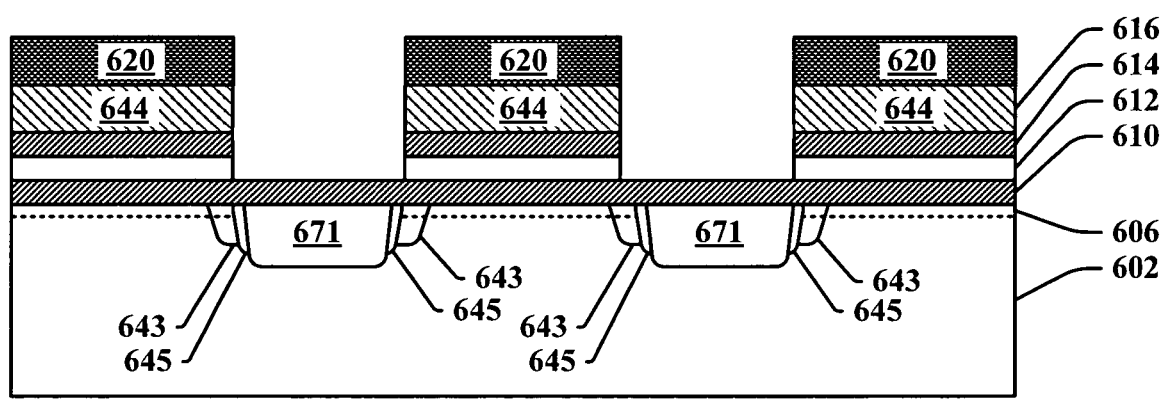

Additionally, according to another aspect of the present invention, additional implants can be executed with the same sidewall spacers 647 into the bulk substrate 602. It should be appreciated by one skilled in the art that the optional additional implants can be done utilizing additional spacers created so that the additional implants are offset, for example. The sidewall spacers 647 can, for example, be damaged by the high dose implant 649 and can be removed as illustrated in FIG. 17.

Figure 18:
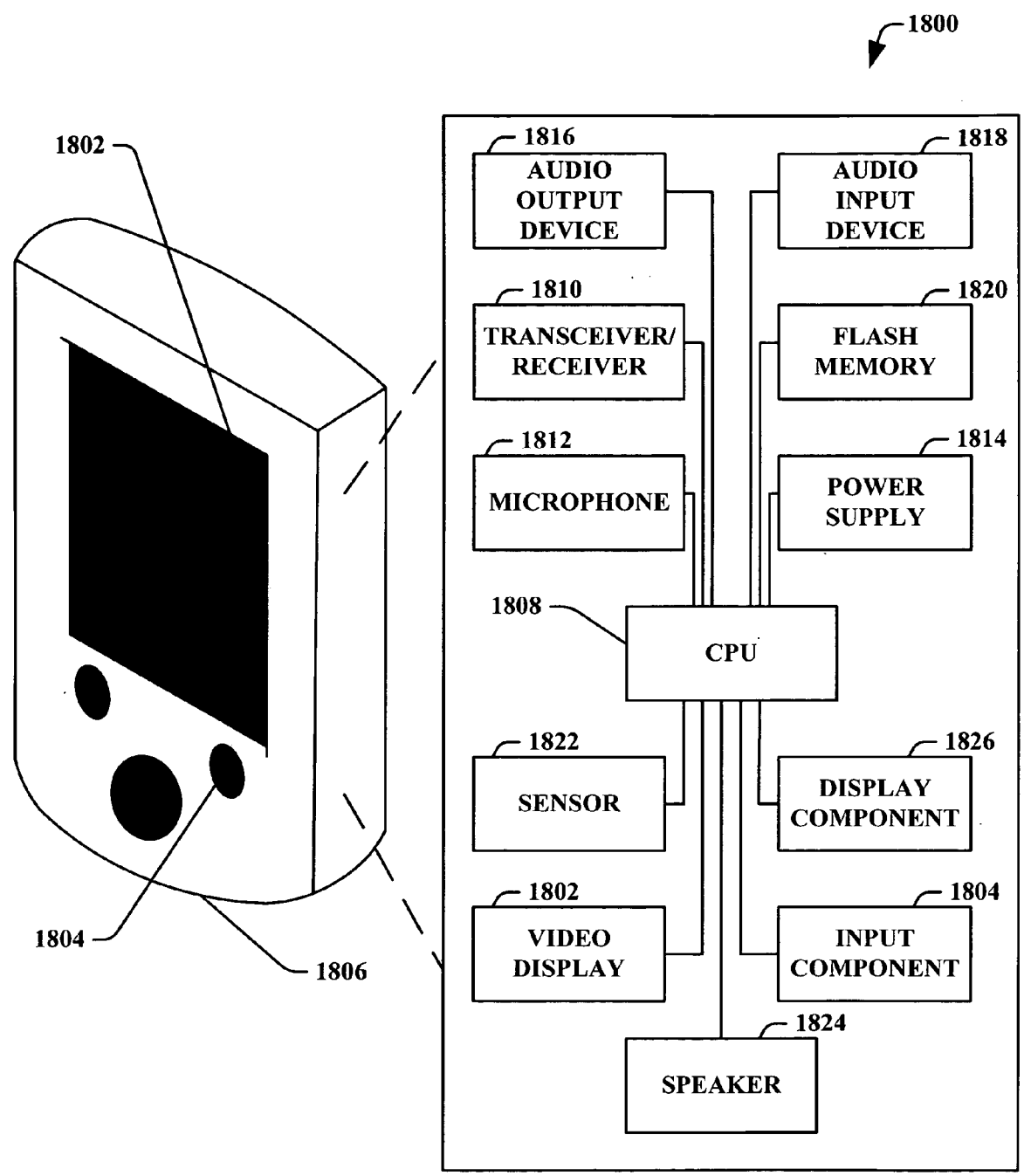
FIG. 18 is an isometric view of a device and block diagram employing deep bitline implant memory according to yet one or more aspects of the present invention.

FIG. 18 is an exemplary portable electronic device, for example, a Personal Data Assistant (PDA) 1800 comprising a video display 1802, an input component 1804, a housing 1806, a CPU 1808, a transceiver and/or a receiver 1810, a microphone 1812, a power supply 1814, an audio output device 1816, an audio input 1818, flash memory 1820, various sensors 1822, and speaker(s) 1824. The flash memory 1820 manufactured according using a deep bitline implant to avoid program disturb, of the present invention. The audio input device 1818 can be a transducer, for example. The input component 1804 can include a keypad, buttons, dials, pressure keys, and the like. The video display 1802 can be a liquid crystal display, a plasma display, an LED display, and the like, for displaying visual data and information. In accordance with another embodiment of the claimed subject matter, the portable device with flash memory 1820 manufactured according to a deep arsenic bitline implant to avoid program disturb, of the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 1820 can include random access memory, read only memory, optical memory, audio memory, magnetic memory, and the like.

According to one embodiment of the present invention, the CPU 1808 is configured to communicate with the audio input device 1818, the audio output device 1816 and a display component 1826. The display component 1826 can be separate and distinct from the video display 1802. The CPU 1808 can execute control functions based on inputs from the user, entered using the input component 1804, for example. Based on those inputs, for example the display component can display a graph, a photo, a map, a chart, a video, and the like. The PDA 1800 is also configured to output data as an audio signal, for example a song, a message, a warning sound, various tones, recordings, etc. In another embodiment of the present invention the PDA 1800 can communicate with other electronic devices, for example computers, cell phones, other PDAs, and the like. The PDA 1800 is also configured to transmit digital data wirelessly from one user to another. This is done utilizing the transmitter/receiver 1810 to either transmit or receive data. Additionally, sensors 1822 can be utilized to sense data external to the PDA 1800, for example, temperatures, radiation levels, pressures, and the like. It will be further appreciated that any of the layers described herein can be formed in any one or more suitable manners, either alone or in combination, such as with spin-on techniques, sputtering techniques (e.g., magnetron or ion beam sputtering), growth and/or deposition techniques such as chemical vapor deposition (CVD) and/or low pressure chemical vapor deposition (LPCVD), for example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming at least a portion of a dual bit memory core array upon a semiconductor substrate, the method comprising:

forming two adjacent symmetric dual bit memory cells; each comprising a charge trapping dielectric layer configured to store two bits of data therein, and defining a first bitline opening there between wherein each of the memory cells are symmetrical about a centerline perpendicular to and passing through the charge trapping dielectric layer wherein two bits can be stored within the charge trapping dielectric layer with a bit stored on either side of the centerline approximately equidistant from each other;

forming first polysilicon layer features over the charge trapping dielectric layer;

performing a first bitline implant into the first bitline opening to establish a buried first bitline within the substrate;

forming a sidewall spacer adjacent to the charge trapping dielectric and the polysilicon layer features to define a second bitline opening between the adjacent memory cells;

performing a deep arsenic implant into the second bitline opening to establish a second bitline within the substrate that is smaller than the first bit line; and performing back end processing.

2. The method of claim 1, wherein the deep arsenic implant energy is about 20-40 keV.

3. The method of claim 1, wherein the deep arsenic implant is formed to a depth of 70 nanometers or greater.

4. The method of claim 1, wherein the spacer material is formed to a thickness of 5 nanometers or greater.

5. The method of claim 1, wherein the spacer is etched to a thickness of about 5 to 30 nanometers.

6. The method of claim 5, wherein the etching process comprises plasma etching.

7. A method of forming at least a portion of a dual bit memory core array upon a semiconductor substrate, the method comprising:

forming two adjacent symmetric dual bit memory cells; each comprising a charge trapping dielectric layer configured to store two bits of data therein, and defining a first bitline opening there between wherein each of the memory cells are symmetrical about a centerline perpendicular to and passing through the charge trapping dielectric layer wherein two bits can be stored within the charge trapping dielectric layer with a bit stored on either side of the centerline approximately equidistant from each other;

forming first polysilicon layer features over the charge trapping dielectric layer;

performing a first bitline implant into the first bitline opening to establish a buried first bitline within the substrate;

forming sidewall spacers adjacent to the polysilicon features thereby defining a second bitline opening;

performing a vertical deep arsenic implant to create a second source/drain the second bitline opening to establish a second bitline within the substrate that is smaller and deeper than the first bitline; and performing backend processing.

8. The method of claim 7, wherein the deep arsenic implant energy is about 20-40 keV.

9. The method of claim 7, wherein the deep arsenic implant is formed to a depth of 70 nanometers or greater.

10. The method of claim 7, wherein the layer of spacer material is formed to a thickness of 70 nanometers or greater.

11. The method of claim 7, wherein the first sidewall spacer is etched to a thickness of about 5 to 30 nanometers.

12. The method of claim 7, wherein the etching comprises plasma etching.

13. The method of claim 7, wherein the pocket implant is performed at an energy level of around 10 KeV to 40 KeV.

14. The method of claim 7, wherein the pocket implant is performed at an energy level of around 5 KeV to 30 KeV.

15. The method of claim 7, wherein the vertical arsenic implant is formed to a depth of about 500 Angstroms.

16. The method of claim 7, wherein the vertical deep arsenic implant is performed at a dosage of about 1e15/cm2.

17. The method of claim 7, wherein the second bitlines have a resulting dopant concentration of about 2E20/cm3.

18. The method of claim 7, wherein the second bitline opening is formed to a width of about 50 nanometers.

19. The method of claim 7, wherein an optional high temperature oxidation is performed at temperatures between around 700 to 1200 degrees Celsius.

20. The method of claim 7, wherein a high density plasma oxide deposition to form the layer of spacer material is performed at a temperature of about 300 C to about 700 C under a pressure of about 1-10 mTorr.

21. The method of claim 7, wherein the pocket implant is performed at an energy level of around 5 KeV to 30 KeV.

22. A communication device, comprising:

a flash memory CPU;

the flash memory operatively coupled to the CPU and configured to transfer data to and from the CPU;

an input component for entering the data;

a display component for displaying information;

a plurality of switches;

flash memory, the flash memory comprising two adjacent symmetric dual bit memory cells formed by the process of;

forming a charge trapping dielectric layer over a substrate;

forming a polysilicon layer over the charge trapping dielectric layer;

forming a hardmask over the polysilicon layer;

patterning the hardmask to form a patterned polysilicon layer and defining a first bitline opening between the two adjacent symmetric dual bit memory cells;

wherein each of the memory cells are symmetrical about a centerline perpendicular to and passing through the charge trapping dielectric layer wherein two bits can be stored within the charge trapping dielectric layer with a bit stored on either side of the centerline approximately equidistant from each other;

performing a vertical arsenic implant to create a source/drain in the first bitline opening;

forming spacer material on sidewalls of the patterned polysilicon to define a second bitline opening that is smaller than the first bitline opening; and performing a vertical deep arsenic implant into the second bitline opening.

* * * * *